United States Patent
Lee et al.

(10) Patent No.: US 6,716,704 B2
(45) Date of Patent: Apr. 6, 2004

(54) METHODS OF FABRICATING READ ONLY MEMORY DEVICES INCLUDING THERMALLY OXIDIZED TRANSISTOR SIDEWALLS

(75) Inventors: Hee-Jueng Lee, Kyunggi-do (KR); Ki-Chang Yoon, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/085,369

(22) Filed: Feb. 28, 2002

(65) Prior Publication Data

US 2002/0197799 A1 Dec. 26, 2002

(30) Foreign Application Priority Data

Jun. 22, 2001 (KR) .......................... 2001-35701

(51) Int. Cl.[7] ........................................... H01L 21/336
(52) U.S. Cl. ....................................................... 438/265
(58) Field of Search ............................................ 438/265

(56) References Cited

U.S. PATENT DOCUMENTS

| | | | | |
|---|---|---|---|---|
| 5,352,619 A | * | 10/1994 | Hong | 438/263 |
| 5,501,996 A | * | 3/1996 | Yang et al. | 438/263 |
| 6,329,117 B1 | | 12/2001 | Padmanaban et al. | 430/270.1 |

* cited by examiner

Primary Examiner—Son Mai
Assistant Examiner—Thao P. Le
(74) Attorney, Agent, or Firm—Myers Bigel Sibley & Sajovec

(57) ABSTRACT

A ROM device is fabricated by forming a first conductive layer pattern including a sidewall, on an insulating layer on an integrated circuit substrate. Ions are implanted into the integrated circuit substrate using the first conductive layer pattern as an implantation mask. At least a portion of the integrated circuit substrate, and at least a portion of the sidewall are thermally oxidized, to form a thermal oxide layer on at least a portion of the integrated circuit substrate and on the sidewall, and to form a buried doping layer from the implanted ions beneath the thermal oxide layer. A second conductive layer pattern is then formed on at least a portion of the thermal oxide layer and on at least a portion of the first conductive layer pattern.

14 Claims, 7 Drawing Sheets

US 6,716,704 B2

METHODS OF FABRICATING READ ONLY MEMORY DEVICES INCLUDING THERMALLY OXIDIZED TRANSISTOR SIDEWALLS

RELATED APPLICATION

This application claims the benefit of Korean Patent Application No. 2001-35701, filed Jun. 22, 2001, the disclosure of which is hereby incorporated herein by reference in its entirety as if set forth fully herein.

FIELD OF THE INVENTION

This invention relates to integrated circuit devices and fabrication methods, and more particularly Read Only Memory (ROM) devices and fabrication methods therefor.

BACKGROUND OF THE INVENTION

Integrated circuit Read Only Memory (ROM) devices are widely used for storing programs and/or data in a nonvolatile manner. Once data is programmed into a ROM device, it remains permanently in the ROM device and can be read but generally cannot be overwritten. As is well known to those having skill in the art, a ROM generally includes a transistor array in a cell region, wherein individual transistors are programmed to store a one or a zero using well known techniques. Supporting circuitry, such as address decoders and/or controllers also may be included in a peripheral region of the ROM.

As ROM devices become more highly integrated, the number of transistors per unit area may increase, and the linewidths may be reduced. This increase in density and/or decrease in linewidth may undesirably increase resistance and/or parasitic capacitance, and may also undesirably decrease the reliability and/or yield of the devices.

FIG. 1 is a plan view of a cell region of a conventional ROM. FIGS. 2, 3, 4 and 5 are cross-sectional views which may be obtained by cutting the cell region of FIG. 1 along lines of I—I, II—II, III—III and IV—IV, respectively.

Referring to FIGS. 1–5, the entire cell region is an active region. That is, no isolation layer is formed in the cell region. High concentration N-type doping layers 20 buried in a substrate are formed as parallel lines. The surface of the substrate is covered with an insulating layer. The insulating layer includes a gate insulation layer and/or a thick insulation layer 60 on the buried high concentration N-type doping layer 20 that insulates a gate line 10 from the buried doping layer 20. The gate lines 10 are parallel lines which cross the buried doping layers 20. A first polysilicon layer pattern 50 is provided on the gate insulation layer and at a lattice region where each of the gate lines 10 crosses the parallel lines, each of which lies between the buried high concentration N-type doping layers 20. The first polysilicon layer pattern 50 provides a gate electrode at the lattice region, together with a second polysilicon layer of the gate line 10. At regions outside of the gate electrodes, the gate line 10 is composed of the second polysilicon layer. At some of the gate electrodes covered by the first polysilicon layer pattern 50, indicated by the reference number 40 of FIG. 1, a channel layer ion implantation is performed through a pattern mask. The ROM is programmed according to the ion implantation.

A Plasma Enhanced Chemical Vapor Deposition (PECVD) oxide layer 70 is stacked over the gate line 10, and a Boro-Phospo-Silicate-Glass (BPSG) layer 80 is stacked thereon to form a planarized interlayer insulation layer. A metal interconnection 30 is formed on the planarized interlayer insulation layer. In FIGS. 1–5, the metal interconnection 30 is formed once per two line patterns in parallel with the line patterns of the buried high-concentration N-type doping layer 20 and over the line patterns. A protective layer 90 is formed over the metal interconnection 30. The metal interconnection 30 provides a main bit line and is connected with the buried high concentration N-type doping layer 20, which is a sub-bit line below the metal interconnection 30, at a periphery of a selected cell transistor.

In order to select a certain memory cell, non-zero voltages may be applied on the gate line 10 passing the selected cell transistor, and on the main bit line connected with the buried high concentration N-type doping layer 20 comprising a drain region of the selected cell transistor. As a result, the voltage of the buried high concentration N-type doping layer 20 composing a source region becomes 0 V. If a threshold voltage applied on a channel region of a gate electrode bottom of the selected cell transistor is programmed to be higher than a voltage applied on the gate line 10, the cell transistor enters an "off" state and the bit line is not discharged, so that the cell transistor is read as "off". Conversely, if the threshold voltage applied on the channel region of the selected cell transistor is programmed to be lower than the voltage applied on the gate line 10, the cell transistor enters an "on" state and the bit line is discharged, so that the cell transistor is read as "on". The design, fabrication and operation of conventional ROM devices are well known to those having skill in the art and need not be described further herein.

FIGS. 6–9 are cross-sectional views of a first polysilicon layer along the gate line in a conventional ROM device, during intermediate fabrication steps.

Referring to FIG. 6, a gate insulation layer 110 of about 100 Å in thickness is formed on an integrated circuit substrate, such as a silicon semiconductor substrate 100. A first polysilicon layer 120 is stacked in a thickness of about 200 Å to about 1000 Å. A capping layer 130 is formed of a silicon nitride layer, and an antireflection layer 140 is formed of a silicon oxynitride layer thereon. The resultant structure is patterned to form a line pattern composed of the antireflection layer 140, the capping layer 130, and the first polysilicon layer 120. During patterning, a partial thickness of the gate insulation layer 110 outside the line pattern is removed by over-etching.

Referring to FIG. 7, a silicon nitride layer is conformally stacked over the line pattern in a thickness of about 100 Å to about 500 Å and removed by anisotropic etching to form a sidewall spacer 160 at the sidewall of the line pattern composed of the first polysilicon layer 120 and the capping layer 130. As a partial thickness of the spacer 160 is removed by over-etching, the gate insulation layer covering the antireflection layer and the substrate also is removed. N-type ions are implanted into the substrate in a dose amount of about $10^{15}$ ions/cm$^2$. Low ion implantation energy below 30 KeV is applied at the substrate surface to form a high concentration N-type doping layer 150 between the patterns including the first polysilicon layer 120.

Referring to FIG. 8, the substrate is thermally oxidized to form a thermal oxide layer 170 on the substrate 100, except the pattern covered with the capping layer 130. The surface of the substrate 100 is rapidly oxidized in thermal oxidation due to the earlier ion implantation, thereby volumetrically expanding. Thus, the thermal oxide layer 170 is thicker than the gate insulation layer 111 under the first polysilicon layer 120 of the pattern. The ion-implanted dopants are moved downward by the thermal oxide layer 170, to form a buried high concentration N-type doping layer 151. The first polysilicon layer 120 is covered with the capping layer 130 and the spacer 160, thereby not being oxidized.

Referring to FIG. 9, the spacer 160 and the capping layer 130 covering the first polysilicon layer 120 are removed by wet etching, and a second polysilicon layer 180 is stacked. The first polysilicon layer 120 and the second polysilicon layer 180 are patterned to form a gate line including a gate electrode. Subsequent processes are performed similar to a conventional CMOS process, and are well known to those skilled in the art. Accordingly, additional fabrication details need not be described further herein.

According to a conventional method of fabricating a ROM, the reliability of the gate insulation layer may be degraded. In particular, the gate insulation layer exists at a region V of FIG. 9, where the spacer was between the thermal oxide layers 170 covering the buried doping layer 151 and the gate insulation layer under the first polysilicon layer 120. The gate insulation layer under the first polysilicion layer 120 may be preserved during the entire process. But, in the region V, the oxide layer of the spacer bottom may become thin by partial etching during the step of forming the line pattern (FIG. 6), may become thick by the thermal oxidation step of forming the buried doping layer (FIG. 8), and again may become thin by etching at the step of removing the spacer (FIG. 9). For example, when a spacer nitride layer is removed, an oxide layer below the nitride layer may be removed in a thickness of 40 Å to 80 Å. Consequently, the reliability of the gate insulation layer in the region V may be degraded and induce an operational failure and/or an insulation breakdown between the buried doping layer 151 and the second polysilicon layer 180.

Also, according to the conventional method, the antireflection layer is formed of silicon oxynitride, which may be a source of particles. Additionally, if the antireflection layer reacts with a capping layer thereunder, a portion may remain after removing the capping layer. In this case, the remaining portion may function as a blocking layer with respect to the first polysilicon layer, thereby inducing an electrical short between the gate lines.

SUMMARY OF THE INVENTION

According to some embodiments of the invention, a ROM device is fabricated by forming a first conductive layer pattern including a sidewall, on an insulating layer on an integrated circuit substrate. Ions are implanted into the integrated circuit substrate using the first conductive layer pattern as an implantation mask. At least a portion of the integrated circuit substrate, and at least a portion of the sidewall are thermally oxidized, to form a thermal oxide layer on at least a portion of the integrated circuit substrate and on the sidewall, and to form a buried doping layer from the implanted ions beneath the thermal oxide layer. A second conductive layer pattern is then formed on at least a portion of the thermal oxide layer and on at least a portion of the first conductive layer pattern. According to these embodiments, the thermal oxide layer that is formed on the sidewall can reduce or prevent a thinning of the insulating layer and the consequent degradation in reliability, operation and/or yield.

According to other embodiments of the invention, a sidewall spacer is not formed on the sidewall of the first conductive layer pattern between the forming of a first conductive layer and the thermally oxidizing layer. According to still other embodiments of the invention, at least a portion of the integrated circuit substrate and at least a portion of the sidewall are thermally oxidized without thermally oxidizing the top and bottom of the first conductive layer pattern.

In still other embodiments of the present invention, the first conductive layer pattern comprises a first conductive layer on the insulating layer and a capping layer on the first conductive layer. In these embodiments, the capping layer is removed after the thermal oxidizing and prior to forming the second conductive layer pattern. In other embodiments, a photoresist pattern also is formed on the capping layer, and the capping layer and the first conductive layer are etched using the photoresist pattern as an etch mask. The photoresist then may be removed.

In yet other embodiments, an antireflection layer is formed on the capping layer, and a photoresist pattern is formed on the antireflection layer. After etching, the photoresist pattern and the antireflection layer are removed. In other embodiments, the antireflection layer can comprise an organic antireflection layer. By using an organic antireflection layer, the antireflection layer may be removed completely, to thereby reduce or prevent shorting.

Integrated circuit ROM devices according to some embodiments of the invention include an integrated circuit substrate, an insulating layer on the integrated circuit substrate, and a first conductive layer pattern including a sidewall on the insulating layer opposite the integrated circuit substrate. A thermal oxide layer is on the integrated circuit substrate and directly on the sidewall of the first conductive layer pattern. A buried doping layer is in the integrated circuit substrate beneath the thermal oxide layer. A second conductive layer pattern is on at least a portion of the thermal oxide layer and on at least a portion of the first conductive layer pattern.

In still other embodiments of ROM devices, the second conductive layer line pattern is directly on the first conductive layer line pattern opposite the insulating layer. In yet other embodiments, both the first and second conductive layer patterns comprise polysilicon.

DETAILED DESCRIPTION OF PREFERRED EMBODIMENTS

Figure 1:
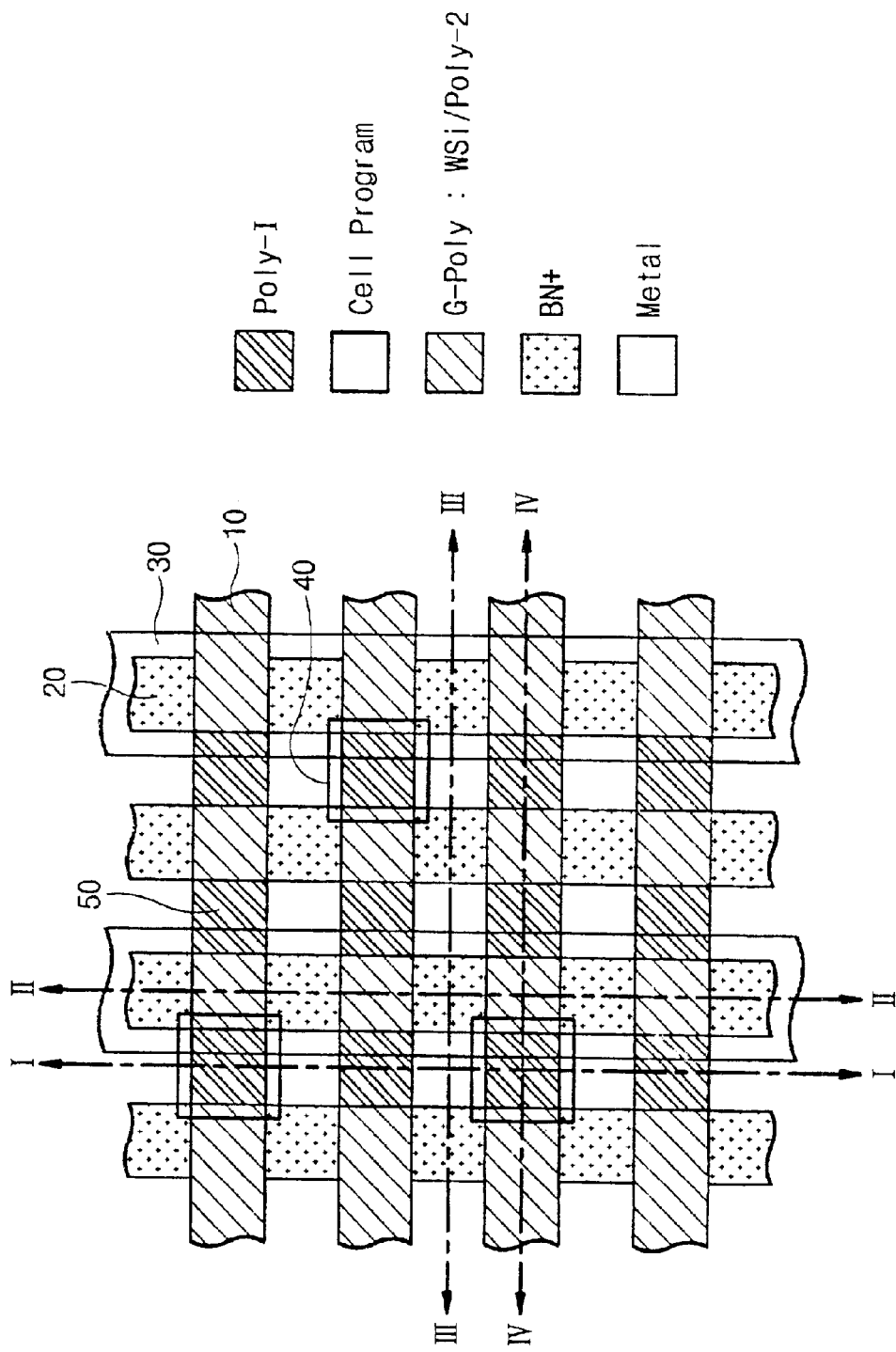
FIG. 1 is a plan view of a cell region of a conventional ROM.
Figure 2:
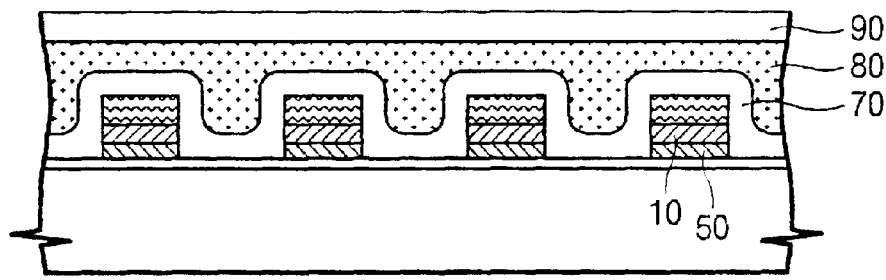
FIGS. 2–5 are cross-sectional views which may be obtained by cutting the cell region of FIG. 1 along lines of I—I, II—II, III—III, and IV—IV, respectively.
Figure 3:
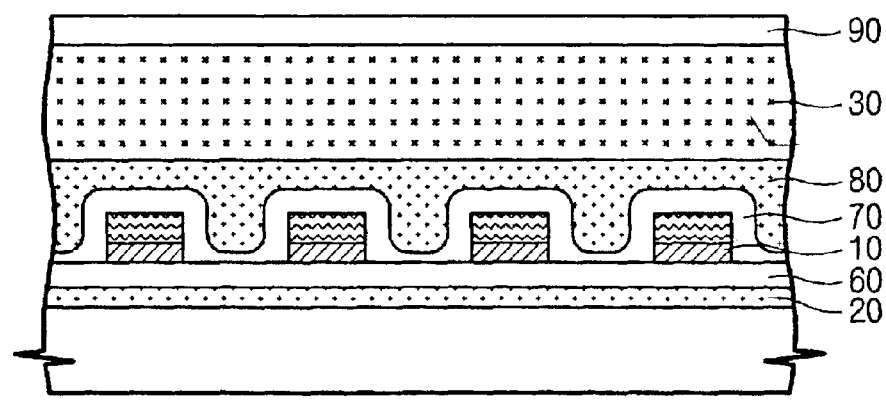
Figure 4:
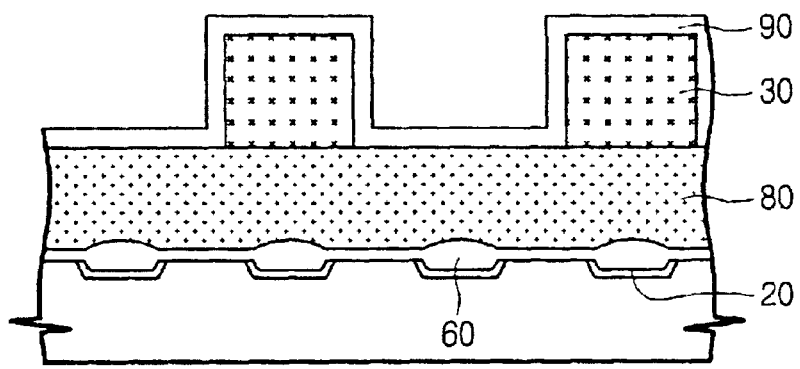
Figure 5:
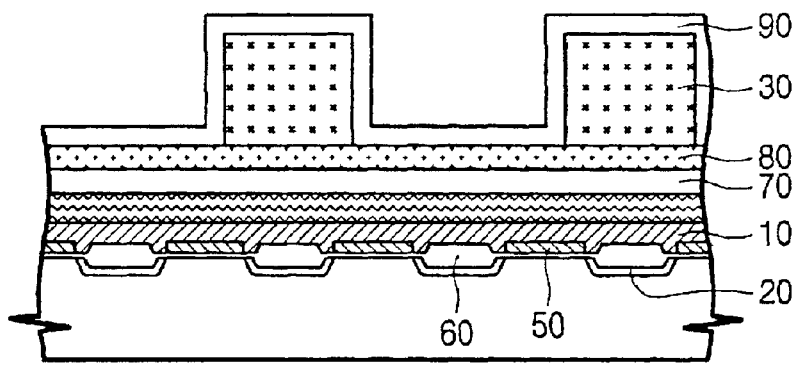
Figure 6:
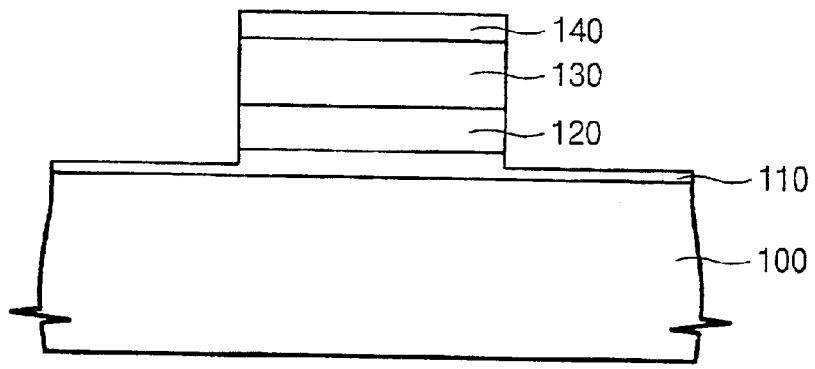
FIGS. 6–9 are cross-sectional views of a first polysilicon layer along a gate line in a conventional ROM device, during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 10:
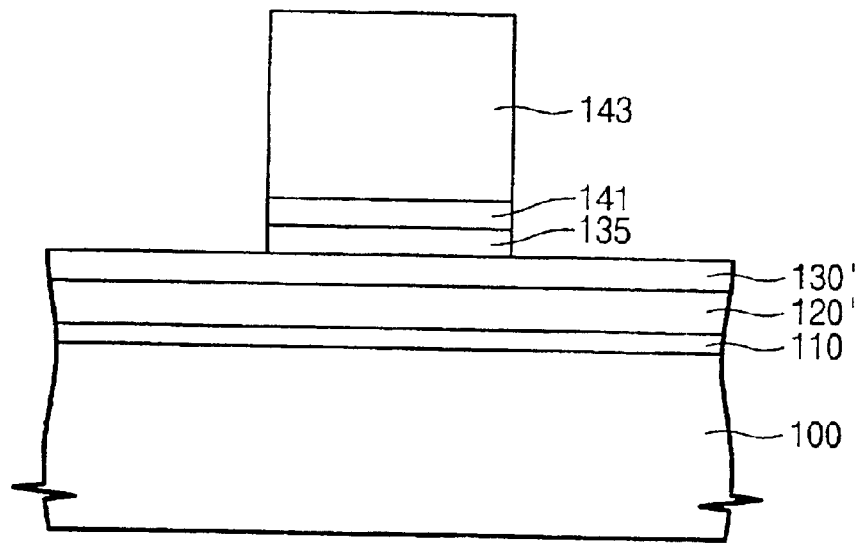
FIGS. 10–13 are cross-sectional views of integrated circuit ROM devices according to embodiments of the present invention, during intermediate fabrication steps according to embodiments of the present invention.

FIG. 10 illustrates forming a first conductive layer pattern including a sidewall on an insulating layer on an integrated circuit substrate according to some embodiments of the present invention. In particular, as shown in FIG. 10, a gate insulating layer 110 is formed on an integrated circuit substrate, such as a silicon semiconductor substrate 100. In some embodiments, the gate insulating layer 110 has a thickness of about 100 Å, and may be formed by thermal oxidation of silicon.

Still referring to FIG. 10, a first conductive layer, such as a first polysilicon layer 120' is formed on the gate insulating layer 110. In some embodiments, chemical vapor deposition (CVD) may be used to form the polysilicon layer 120' having a thickness of about several hundred Ångstroms. A capping layer 130', for example comprising silicon nitride, having a thickness of, for example, about several hundred Ångstroms then is formed on the first polysilicon layer 120' and an organic antireflection layer 141 is formed on the capping layer 130'. Organic antireflection layers are well known to those having skill in the art, and may comprise, for example, acrylate and/or other organic compounds. See, for example, U.S. Pat. No. 6,329,117, entitled Antireflection or Light-Absorbing Coating Composition and Polymer Therefor, the disclosure of which is hereby incorporated by reference herein in its entirety as if set forth fully herein. Also, in some embodiments, as shown in FIG. 10, a hard mask layer 135 comprising, for example, silicon dioxide, may be formed before the antireflection layer 141 is formed.

Figure 11:
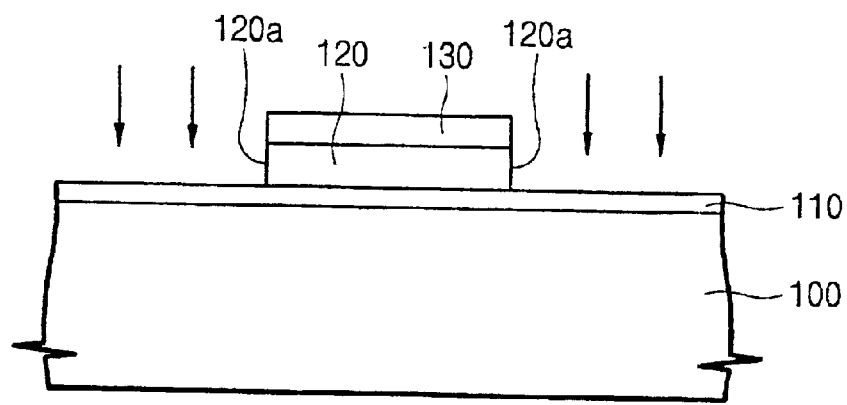

Still referring to FIG. 10, a photoresist pattern 143 is formed on the organic antireflection layer 141, for example using a conventional photolithography process. Then, as shown in FIG. 10, the organic antireflection layer 141 and the hard mask layer 135 are etched, using the photoresist pattern 143 as an etch mask, to form an organic antireflection layer pattern 141 and a hard mask 135. Then, the photoresist pattern 143 and the organic antireflection layer pattern 141 are removed. Using the hard mask 135 as an etch mask, the capping layer 130' and the first polysilicon layer 120' are etched to form a capping layer pattern 130 and a first polysilicon layer pattern 120, as shown in FIG. 11. The hard mask 135 is then removed.

FIG. 11 illustrates implanting ions into the integrated circuit substrate using the first conductive layer pattern as an implantation mask. In particular, as shown in FIG. 11, the photoresist pattern 143 and the organic antireflection layer pattern 141 are removed, for example by ashing. The first polysilicon layer 120' is etched using the capping layer pattern 130 as an etch mask, to thereby form a first conductive layer pattern, such as a first polysilicon layer pattern 120. The etching selectivity ratio preferably is adjusted so as to remove little or none of the gate insulating layer 110 on the substrate.

Figure 7:
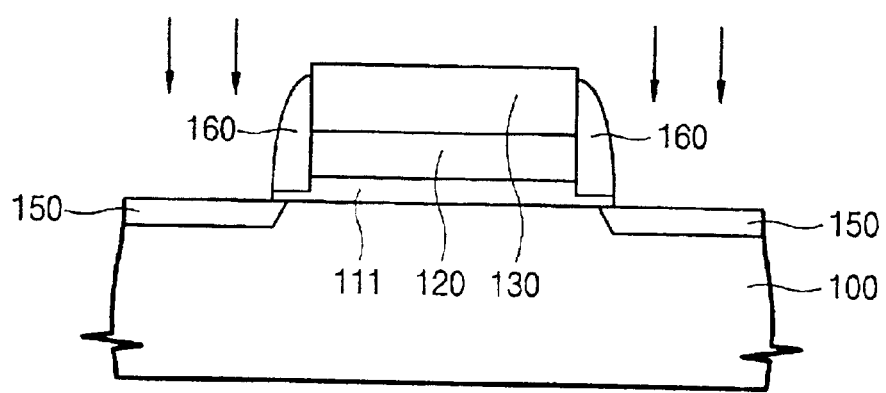
Figure 8:
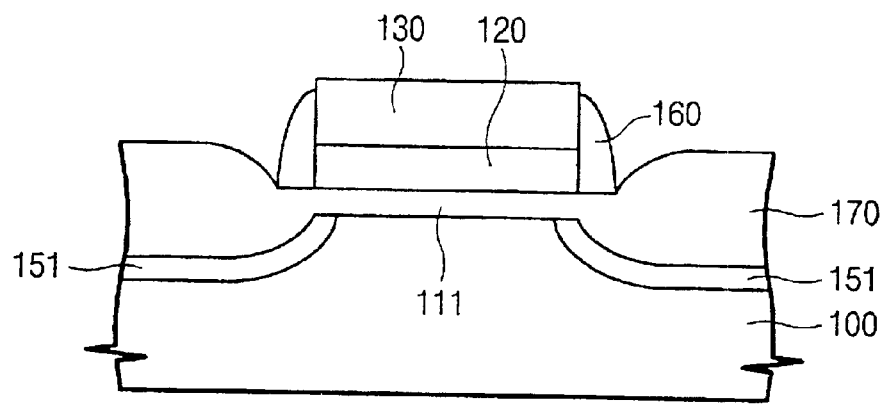
Figure 9:
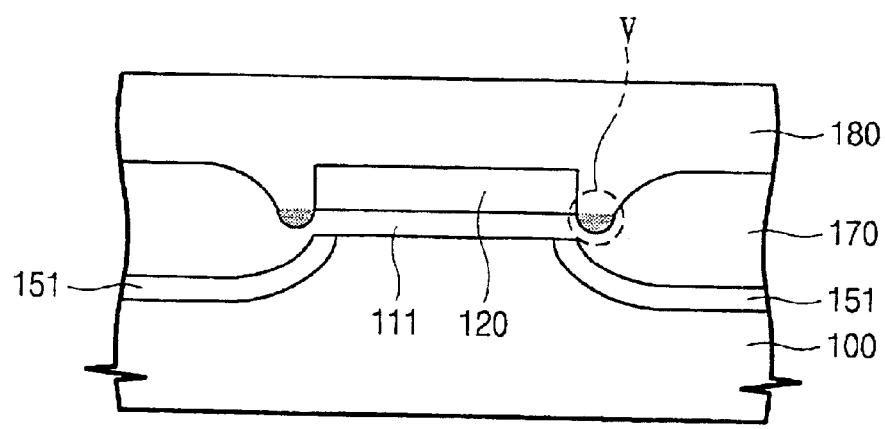

Still referring to FIG. 11, an ion implantation is performed as indicated by the arrows in FIG. 11, using the first conductive layer pattern 120 as an ion implantation mask. As shown in FIG. 11, and in contrast to FIG. 7 that was described above, a sidewall spacer such as a silicon nitride sidewall spacer is not formed on the sidewall 120a of the first conductive layer pattern 120. As a result, in some embodiments, the thickness of the silicon nitride capping layer 130 may be reduced to between about 200 Å and about 300 Å, compared to a conventional thickness of about 700 Å. Arsenic may be used for ion implantation, and the ion implantation may be performed, in some embodiments, at an implantation energy of 30 KeV and a dosage above about $10^{14}$ ion/cm$^2$.

Figure 12:
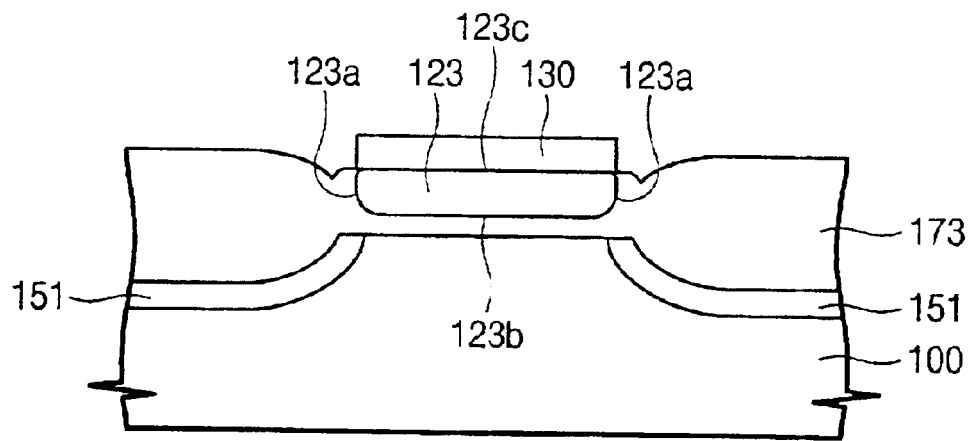

FIG. 12 illustrates thermally oxidizing at least a portion of the integrated circuit substrate, and at least a portion of the sidewall, to form a thermal oxide layer on at least a portion of the integrated circuit substrate and on the sidewall, and to form a buried doping layer from the implanted ions beneath the thermal oxide layer, according to some embodiments of the invention. In particular, as shown in FIG. 12, the thermal oxidation is performed on both sides of the first polysilicon layer pattern 120, to thereby form a thermal oxide layer 173 on the substrate 100 where the ion implantation was performed in FIG. 11, to thereby form a buried doping layer 151 beneath the thermal oxide layer 173. The buried doping layer 151 that is buried beneath the thermal oxide layer 173 can have a high doping concentration. As also shown in FIG. 12, the sidewall 123a of the first polysilicon layer 123 that is not protected by the capping layer pattern 130 thereon is oxidized along with the substrate surface. Thus, as shown in FIG. 12, the first conductive layer pattern 123 includes a bottom 123b adjacent the substrate 100, and a top 123c opposite the substrate 100. According to some embodiments, during thermal oxidation, at least a portion of the substrate 100 is thermally oxidized, and at least a portion of the sidewall 123a also is oxidized, without thermally oxidizing the top 123c and the bottom 123d.

Figure 13:
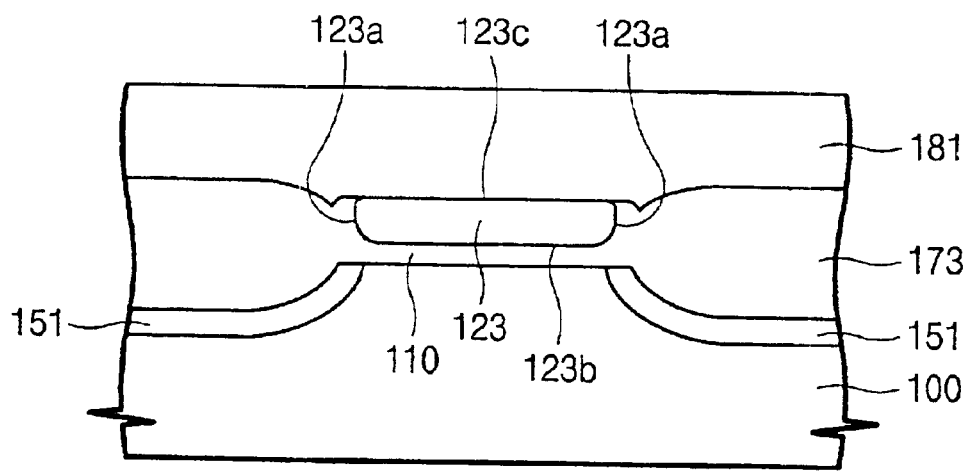

FIG. 13 illustrates forming a second conductive layer pattern on at least a portion of the thermal oxide layer and on at least a portion of the first conductive layer pattern, according to some embodiments of the present invention. More specifically, as shown in FIG. 13, the capping layer 130 is removed. For example, when the capping layer 130 comprises silicon nitride, it may be removed by phosphoric acid wet etching. A second conductive layer, such as a second polysilicon layer 181, is formed on the substrate 100, including on the thermal oxide layer 173 and on the first conductive layer 123. A gate line then may be formed by patterning, using conventional techniques that were described above. In particular, a gate line may be formed in a vertical direction with the pattern in a horizontal direction that is formed by the first polysilicon layer 123. Thus, the first polysilicon layer 123 may be patterned together with a gate line using self-alignment techniques. At the lattice region where the line region of the former step and the gate line cross, at the gate region, the gate line further includes the first polysilicon layer pattern between the gate insulating layer and the second polysilicon layer 181. Further processing then may be performed to selectively program the ROM using, for example, conventional selective ion implantation technique.

Still referring to FIG. 13, integrated circuit ROM devices, according to some embodiments of the invention, include an integrated circuit substrate 100, an insulating layer 110 on the integrated circuit substrate, and a first conductive layer pattern 123, including a sidewall 123a, on the insulating layer 110 opposite the integrated circuit substrate 100. A thermal oxide layer 173 also is provided on the integrated circuit substrate 100, and directly on the sidewall 123a of the first conductive layer pattern 123. A buried doping layer 151 is provided in the integrated circuit substrate 100 beneath the thermal oxide layer 173. A second conductive layer pattern 181 is provided on at least a portion of the thermal oxide layer 173 and on at least a portion of the first conductive layer pattern 123. In other embodiments, the second conductive layer pattern 181 is directly on the top 123c of the first conductive layer pattern 123 opposite the insulating layer 110. Moreover, as also shown in FIG. 13, according to some embodiments of the invention, the second conductive layer pattern 181 is not directly on the sidewall 123a of the first conductive layer pattern 123.

Additional discussion of potential advantages of some embodiments of the present invention now will be provided. In particular, in some embodiments, when forming the first conductive pattern by etching the first polysilicon layer, the etch selectivity ratio can be increased so as not to remove the gate insulating layer. Also, because there is no spacer according to some embodiments of the present invention, when forming a thermal oxide layer at the peripheral part of the first conductive pattern the peripheral part of the first polysilicon layer is oxidized, and the neighboring gate insulating layer becomes thick. In some embodiments, the capping layer can be thin and there can be no spacer, so that it is possible to reduce the time for the phosphoric acid wet etching, and to reduce or minimize the amount of oxide layer that is etched during that time. Thus, according to some embodiments of the invention, it is possible to decrease the risk of conventional insulating layer breakdown that may occur between the gate line and the buried doped layer, due to a conventional thin gate insulating layer at the sidewall of the first polysilicon layer pattern. Moreover, since the risk of insulation breakdown can be reduced, there may be no need to form a thick thermal oxide layer. Thus, process time also may be reduced. Impurity diffusion during the thermal process also may be decreased, which can reduce or prevent channel punch-through.

Some embodiments of the present invention do not form a sidewall spacer, which can simplify the processing steps. Moreover, since the capping layer can be thin, the possibility of particle generation can be reduced.

Finally, when using organic reflection layers according to some embodiments of the present invention, it is possible to reduce particle generation that may result from an unstable inorganic antireflection layer such as a silicon oxynitride layer. It is also possible to reduce or prevent shorting of the gate line. This shorting phenomena may occur conventionally when a blocking layer is formed by an inorganic antireflection layer which reacts with the nitride capping layer. Subsequently, a second polysilicon layer is stacked on the blocking layer and patterned. However, when the second polysilicon layer is patterned with the first polysilicon layer, the first polysilicon layer may partially remain due to the effect of the blocking layer, thereby shorting out the gate. In sharp contrast, according to some embodiments of the invention, which can use an organic capping layer, this shorting can be reduced or prevented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a Read Only Memory (ROM) device, comprising:
   forming a first conductive layer pattern including a sidewall on an insulating layer on an integrated circuit substrate;
   implanting ions into the integrated circuit substrate using the first conductive layer pattern as an implantation mask;
   thermally oxidizing at least a portion of the integrated circuit substrate and at least a portion of the sidewall of the first conductive layer pattern to form a thermal oxide layer on at least the portion of the integrated circuit substrate and on the sidewall of the first conductive layer pattern and to form a buried doping layer from the implanted ions beneath the thermal oxide layer; and
   forming a second conductive layer pattern on at least a portion of the thermal oxide layer and on at least a portion of the first conductive layer pattern.

2. A method according to claim 1 wherein the first conductive layer pattern includes a bottom adjacent the integrated circuit substrate and a top opposite the integrated circuit substrate and wherein the thermally oxidizing comprises thermally oxidizing at least a portion of the integrated circuit substrate and at least a portion of the sidewall of the first conductive layer pattern without thermally oxidizing the top and the bottom.

3. A method according to claim 1 wherein the first conductive layer pattern comprises a first conductive layer on the insulating layer and a capping layer on the first conductive layer and wherein the following is performed between the thermally oxidizing and the forming a second conductive layer pattern: removing the capping layer.

4. A method according to claim 3 wherein the forming a first conductive layer pattern on an insulating layer on an integrated circuit substrate comprises:
   forming an insulating layer on the integrated circuit substrate;
   forming the first conductive layer on the insulating layer;
   forming the capping layer on the first conductive layer;
   forming a photoresist pattern on the capping layer; and
   etching the capping layer and the first conductive layer using the photoresist pattern as an etch mask.

5. A method according to claim 4 wherein the etching is followed by removing the photoresist pattern.

6. A method according to claim 4:
   wherein the following is performed between the forming a capping layer and forming a photoresist pattern:
      forming an antireflection layer on the capping layer;
   wherein the forming a photoresist pattern comprises forming a photoresist pattern on the antireflection layer; and
   wherein the etching is followed by removing the photoresist pattern and the antireflection layer.

7. A method according to claim 6 wherein the antireflection layer comprises an organic antireflection layer.

8. A method according to claim 1 wherein the first and second conductive layer patterns both comprise polysilicon.

9. A method according to claim 3 wherein the capping layer comprises silicon nitride.

10. A method according to claim 1 further comprising selectively programming the ROM.

11. A method according to claim 10 wherein the selectively programming comprises selectively implanting ions into the substrate.

12. A method according to claim 3 wherein the following is performed between the forming a first conductive layer pattern and the implanting ions:
   forming a hard mask on the capping layer;
   forming a photoresist pattern on the hard mask;
   etching the hard mask using the photoresist pattern; and etching the first conductive layer pattern using the hard mask.

13. A method of fabricating a Read Only Memory (ROM) device, comprising:

forming a first conductive layer pattern including a sidewall on an insulating layer on an integrated circuit substrate;

implanting ions into the integrated circuit substrate using the first conductive layer pattern as an implantation mask;

thermally oxidizing at least a portion of the integrated circuit substrate and at least a portion of the sidewall of the first conductive layer pattern to form a thermal oxide layer on at least the portion of the integrated circuit substrate and on the sidewall of the first conductive layer pattern and to form a buried doping layer from the implanted ions beneath the thermal oxide layer; and forming a second conductive layer pattern on at least a portion of the thermal oxide layer and on at least a portion of the first conductive layer pattern;

wherein a sidewall spacer is not formed on the sidewall of the first conductive layer pattern between the forming a first conductive layer pattern and the thermally oxidizing.

14. A method of fabricating a Read Only Memory (ROM) device, comprising:

forming a first conductive layer pattern including a sidewall on an insulating layer on an integrated circuit substrate;

implanting ions into the integrated circuit substrate using the first conductive layer pattern as an implantation mask;

thermally oxidizing at least a portion of the integrated circuit substrate and at least a portion of the sidewall of the first conductive layer pattern to form a thermal oxide layer on at least the portion of the integrated circuit substrate and on the sidewall of the first conductive layer pattern and to form a buried doping layer from the implanted ions beneath the thermal oxide layer; and forming a second conductive layer pattern on at least a portion of the thermal oxide layer and on at least a portion of the first conductive layer pattern, wherein the second conductive layer pattern is spaced apart from the sidewall of the first conductive layer pattern.

* * * * *